United States Patent
Chen et al.

(10) Patent No.: US 10,650,909 B2
(45) Date of Patent: May 12, 2020

(54) TESTING METHOD FOR READING CURRENT OF STATIC RANDOM ACCESS MEMORY

(71) Applicant: Shanghai Huali Integrated Circuit Mfg. Co., Ltd., Shanghai (CN)

(72) Inventors: Pinhan Chen, Shanghai (CN); Dongcheng Wu, Shanghai (CN)

( * ) Notice: Subject to any disclaimer, the term of this patent is extended or adjusted under 35 U.S.C. 154(b) by 0 days.

(21) Appl. No.: 16/191,446

(22) Filed: Nov. 15, 2018

(65) Prior Publication Data

US 2019/0341121 A1    Nov. 7, 2019

(30) Foreign Application Priority Data

May 4, 2018    (CN) .......................... 2018 1 0419274

(51) Int. Cl.
     *G11C 29/50*      (2006.01)
     *G11C 11/419*     (2006.01)

(52) U.S. Cl.
     CPC ............ *G11C 29/50* (2013.01); *G11C 11/419* (2013.01); *G11C 2029/5006* (2013.01)

(58) Field of Classification Search
     CPC ............ G11C 29/50; G11C 2029/5006; G11C 11/412
     USPC .................................................. 365/156, 201
     See application file for complete search history.

(56) References Cited

U.S. PATENT DOCUMENTS 7,233,032 B2 * 6/2007 Liaw ...................... H01L 23/50
                                                                           257/202
8,315,085 B1 * 11/2012 Chang ........................... 365/154

* cited by examiner

*Primary Examiner* — Son L Mai
(74) *Attorney, Agent, or Firm* — Kilpatrick Townsend & Stockton, LLP

(57) ABSTRACT

The present disclosure provides a testing method for reading current of static random access memory, the method comprising: for each basic static random access memory cell, coupling a gate of a first pull-down transistor to a first bit line; setting a word line and the first bit line at a high potential; and sensing current of the first bit line. The testing method provided in the present disclosure can also be applied to static random access memory cells arranged in matrices, so as to efficiently complete the tests for the reading current of the static random access memory in batches.

10 Claims, 3 Drawing Sheets

US 10,650,909 B2

TESTING METHOD FOR READING CURRENT OF STATIC RANDOM ACCESS MEMORY

CROSS-REFERENCES TO RELATED APPLICATIONS

The present application claims priority to Chinese Patent Application No. 201810419274.2, filed on May 4, 2018, entitled "TESTING METHOD FOR READING CURRENT OF STATIC RANDOM ACCESS MEMORY", which is incorporated by reference herein for all purposes.

TECHNICAL FIELD

The present disclosure relates to a testing method, and particularly to a testing method for reading current of static random access memory cell.

BACKGROUND OF THE INVENTION

Static random access memory (SRAM) stores "0" or "1" information for a formed latch by cross-coupled inverters with positive feedback characteristics in a memory cell. Referring to FIG. 1, the structure of a memory cell of the currently common static random access memory is composed of six transistors. FIG. 1 shows a circuit structure diagram of one memory cell of common static random access memory, and the circuit structure of the six transistors mentioned above has symmetry and comprises a first pass-gate transistor (PG1), a first pull-up transistor (PU1), a first pull-down transistor (PD1), a second pass-gate transistor (PG2), a second pull-up transistor (PU2) and a second pull-down transistor (PD2) connected between a first bit line (BL) and a second bit line (BLB). The first pull-up transistor (PU1) and the first pull-down transistor (PD1) form a first inverter, the second pull-up transistor (PU2) and the second pull-down transistor (PD2) form a second inverter, and the first inverter and the second inverter are cross-coupled, that is, an input end of the first inverter is electrically connected to an output end Nb of the second inverter, and an output end Na of the first inverter is electrically connected to an input end of the second inverter so as to form a latch for locking data logic values. The gates of the first pass-gate transistor (PG1) and the second pass-gate transistor (PG2) and the word line are in connection, and respectively control the connection or disconnection of the first inverter and the second inverter to or from the first bit line (BL) and the second bit line (BLB) when performing read/write operations on the SRAM memory.

The static random access memory is an extremely important part in the IC field, and its testing work has important practical application value for ensuring the quality of integrated circuit products. Traditional voltage test-based testing method has been widely applied; however, this method still may not effectively detect certain faults, and as a complement to the voltage testing method, the current testing method can improve fault coverage and product reliability.

Testing the reading current of the static random access memory can effectively screen out abnormal static random memory cells. However, the current existing testing steps for reading current of the static random access memory are complicated, and a large number of leads need to be used in the test, such that a great deal of time is consumed and it is not suitable for batch testing. Specifically, when the current existing method for testing reading current of the static random access memory is tested, signals firstly need to be written by the first bit line (BL) and the second bit line (BLB), then a voltage is applied to the BL and the BLB, and finally the BL and BLB measure the current, and the reading current of the static random access memory is current at a higher current end in two ends of the BL and BLB. In the prior art, the testing method for reading current needs a relatively large number of testing keys and pins as well as a longer testing time to obtain a sufficient amount of testing data for detecting abnormal changes in the memory cell.

Therefore, there is an urgent need for a testing method for reading current of static random access memory cell to reduce the hardware devices required for the test and make the steps simple, and make it convenient for a tester to test static random access memories in batches.

BRIEF SUMMARY OF THE INVENTION

In order to solve the above-mentioned problems, the present disclosure provides a testing method for reading current of static random access memory cell, and the static random access memory cell comprises a first pass-gate transistor, a first pull-up transistor, a first pull-down transistor, a second pass-gate transistor, a second pull-up transistor and a second pull-down transistor connected between a first bit line and a second bit line; a drain of the first pull-up transistor and a drain of the first pull-down transistor are in connection and are connected to a source of the first pass-gate transistor, a gate of the first pull-up transistor and a gate of the first pull-down transistor are in connection and are connected to a source of the second pass-gate transistor, a drain of the first pass-gate transistor and the first bit line are in connection, and a gate of the first pass-gate transistor and a word line are in connection; a drain of the second pull-up transistor and a drain of the second pull-down transistor are in connection and are connected to the source of the second pass-gate transistor, a gate of the second pull-up transistor and a gate of the second pull-down transistor are in connection and are connected to the source of the first pass-gate transistor, a drain of the second pass-gate transistor and the second bit line are in connection, and a gate of the second pass-gate transistor and the word line are in connection; the testing method comprising: coupling the gate of the first pull-down transistor to the first bit line; setting the word line and the first bit line at a high potential; floating the second bit line; and sensing current of the first bit line.

In one embodiment, the reading current flows from the first bit line set at the high potential to the first pass-gate transistor conducted by the word line set at the high potential and the first pull-down transistor conducted by the first bit line set at the high potential.

In one embodiment, the testing method further comprises: coupling the gate of the second pull-down transistor to the second bit line; setting the word line and the second bit line at a high potential; floating the first bit line; and sensing current of the second bit line.

In one embodiment, the reading current flows from the second bit line set at the high potential to the second pass-gate transistor conducted by the word line set at the high potential and the second pull-down transistor conducted by the second bit line set at the high potential.

In one embodiment, the first pull-up transistor and the second pull-up transistor are P-type MOS transistors, and the first pass-gate transistor, the first pull-down transistor, the second pass-gate transistor and the second pull-down transistor are N-type MOS transistors.

The present disclosure further provides a testing method for reading current of static random access memory, and the static random access memory comprises a plurality of static random access memory cells arranged in rows and columns, the static random access memory cells in the same column share one first bit line and one second bit line, and the static random access memory cells in the same row share one word line; each of the static random access memory cells comprises a first pass-gate transistor, a first pull-up transistor, a first pull-down transistor, a second pass-gate transistor, a second pull-up transistor and a second pull-down transistor connected between the first bit line and the second bit line, and a drain of the first pull-up transistor and a drain of the first pull-down transistor are in connection and are connected to a source of the first pass-gate transistor, a gate of the first pull-up transistor and a gate of the first pull-down transistor are in connection and are connected to a source of the second pass-gate transistor, a drain of the first pass-gate transistor and the first bit line are in connection, and a gate of the first pass-gate transistor and the word line are in connection; a drain of the second pull-up transistor and a drain of the second pull-down transistor are in connection and are connected to the source of the second pass-gate transistor, a gate of the second pull-up transistor and a gate of the second pull-down transistor are in connection and are connected to the source of the first pass-gate transistor, a drain of the second pass-gate transistor and the second bit line are in connection, and a gate of the second pass-gate transistor and the word line are in connection; the testing method comprising: coupling a gate of each of the first pull-down transistors to a corresponding first bit line; setting the word lines at a high potential one by one, while floating the remaining of the word lines; setting the first bit lines at a high potential one by one, while floating the remaining of the first bit lines; floating all of the second bit lines; and sensing, one by one, a first bit line current of static random access memory cells, each of which has a word line and a first bit line both set at a high potential.

In one embodiment, the reading current of the static random access memory cell flows from the first bit line set at the high potential to the first pass-gate transistor conducted by the word line set at the high potential and the first pull-down transistor conducted by the first bit line set at the high potential.

In one embodiment, the testing method further comprises: coupling the gate of each of the second pull-down transistors to a corresponding second bit line; setting the word lines at a high potential one by one, while floating the remaining of the word lines; setting the second bit lines at a high potential one by one, while floating the remaining of the second bit lines; floating all of the first bit lines; and sensing, one by one, second bit line current of static random access memory cells, each of which has a word line and a second bit line both set at a high potential.

In one embodiment, the reading current of the static random access memory cell flows from the second bit line set at the high potential to a second pass-gate transistor conducted by the word line set at the high potential and a second pull-down transistor conducted by the second bit line set at the high potential.

In one embodiment, each of the first pull-up transistor and the second pull-up transistor is a P-type MOS transistor, and each of the first pass-gate transistor, the first pull-down transistor, the second pass-gate transistor and the second pull-down transistor is an N-type MOS transistor.

The testing method provided in the present disclosure, the testing steps are simple, the number of hardware interfaces required for the test is reduced, and it is possible for testers to achieve mass tests.

DETAILED DESCRIPTION OF THE DISCLOSURE

The present disclosure is described below in detail in conjunction with the accompanying drawings and particular embodiments. It is noted that the aspects described in conjunction with the accompanying drawings and particular embodiments are merely exemplary, and should not be construed as any limitation on the scope of protection of the present disclosure.

The present disclosure provides a testing method with simple steps to test reading current of static random access memory.

Figure 2:
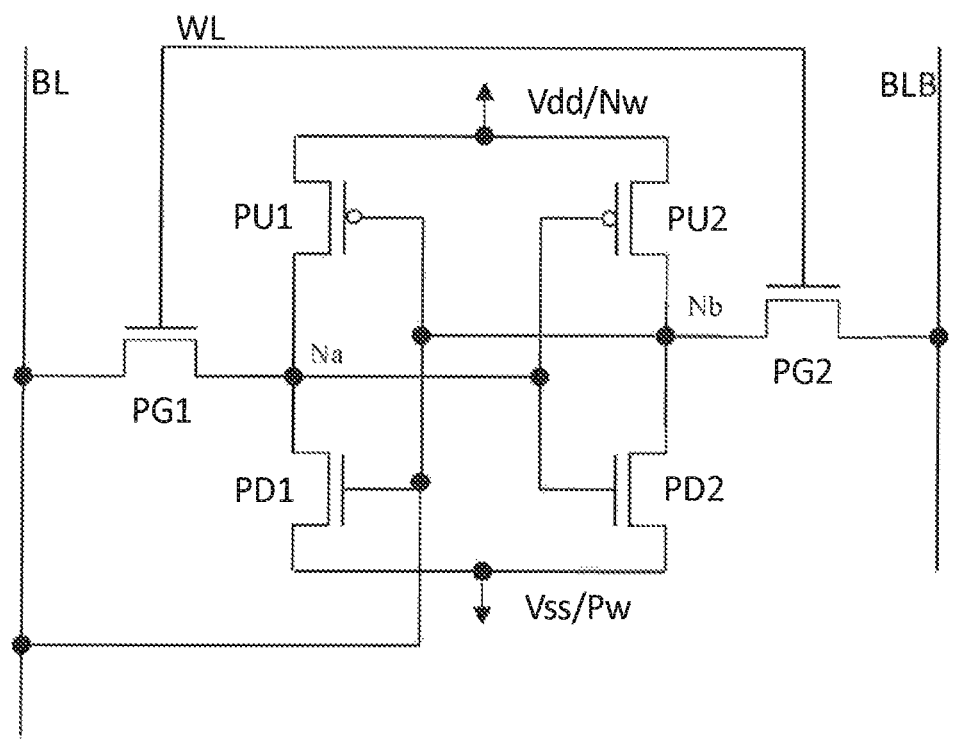
FIG. 2 shows a schematic circuit diagram of an embodiment of testing reading current by a testing method provided in the present disclosure.

FIG. 2 shows a schematic circuit diagram of testing reading current by a testing method provided according to the present disclosure. The static random access memory cell comprises a first pass-gate transistor (PG1), a first pull-up transistor (PU1), a first pull-down transistor (PD1), a second pass-gate transistor (PG2), a second pull-up transistor (PU2) and a second pull-down transistor (PD2) connected between a first bit line (BL) and a second bit line (BLB); a drain of the first pull-up transistor (PU1) and a drain of the first pull-down transistor (PD1) are in connection and are connected to a source of the first pass-gate transistor (PG1), a gate of the first pull-up transistor (PU1) and a gate of the first pull-down transistor (PD1) are in connection and are connected to a source Nb of the second pass-gate transistor (PG2), a drain of the first pass-gate transistor (PG1) and the first bit line (BL) are in connection, and a gate of the first pass-gate transistor (PG1) and the word line are in connection; a drain of the second pull-up transistor (PU2) and a drain of the second pull-down transistor (PD2) are in connection and are connected to the source of the second pass-gate transistor (PG2), a gate of the second pull-up transistor (PU2) and a gate of the second pull-down transistor (PD2) are in connection and are connected to the source Na of the first pass-gate transistor (PG1), a drain of the second pass-gate transistor (PG2) and the second bit line (BLB) are in connection, and a gate of the second pass-gate transistor (PG2) and the word line are in connection. The first pull-up transistor (PU1) and the second pull-up transistor (PU2) are P-type MOS transistors, and the first pass-gate transistor (PG1), the first pull-down transistor (PD1), the second pass-gate transistor (PG2) and the second pull-down transistor (PD2) are N-type MOS transistors.

The testing circuit as shown in FIG. 2 is intended to test current at the BL end, and in order to test the current at the BL end, the gate of the first pull-down transistor (PD1) on the same side as the BL end is connected to the first bit line (BL). When the word line (WL) and the first bit line (BL) access to a high potential at the same time, and the second bit line (BLB) is unloaded, the high potential of the word line (WL) conducts the first pass-gate transistor (PG1) and the high potential of the first bit line (BL) conducts the first pull-down transistor (PD1). At this time, the first pass-gate transistor (PG1) and the first pull-down transistor (PD1) are both turned on, a passage is formed from the first bit line (BL) to a grounded Vss, and the current can flow from the first bit line (BL) to Vss through the conducted first pass-gate transistor (PG1) and first pull-down transistor (PD1), and at this time, although the current at the BL end is not actual reading current, it is analogue reading current that is very close to the actual reading current. Therefore, when measuring the current at the BL end, it can be considered that the current IBL at the BL end is the reading current.

Figure 3:
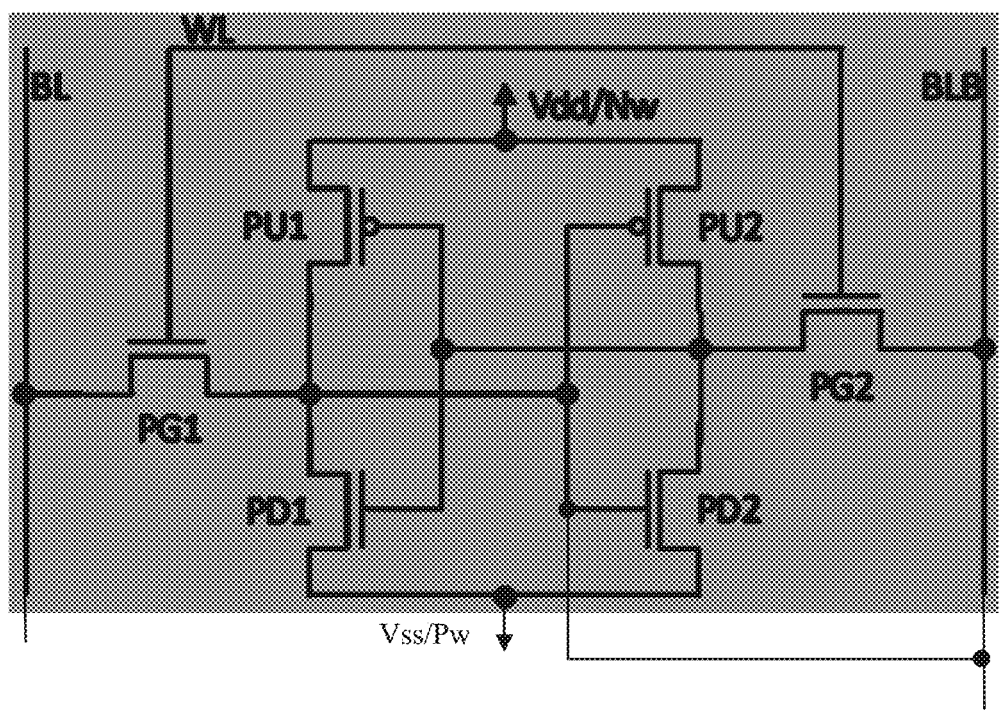
FIG. 3 shows a schematic circuit diagram of another embodiment of testing reading current by a testing method provided in the present disclosure.

As shown in FIG. 3, to test the current at the BLB end, in order to test the current at the BLB end, the gate of the second pull-down transistor (PD2) on the same side as that of the BLB end can be connected to the second bit line (BLB). When the word line (WL) and the second bit line (BLB) access a high potential at the same time, and the first bit line (BL) is unloaded, the high potential of the word line (WL) conducts the second pass-gate transistor (PG2) and the high potential of the second bit line (BLB) conducts the second pull-down transistor (PD2). At this time, the second pass-gate transistor (PG2) and the second pull-down transistor (PD2) are both turned on, a passage is formed from the second bit line (BLB) to a grounded Vss, and the current can flow from the second bit line (BLB) to Vss through the conducted second pass-gate transistor (PG2) and second pull-down transistor (PD2), and at this time, although the current at the BLB end is not actual reading current, it is analogue reading current that is very close to the actual reading current. Therefore, when measuring the current at the BLB end, it can be considered that the current $I_{BLB}$ at the BLB end is the reading current.

By connecting the gate of the pull-down transistor to the bit line at the corresponding side, and setting the bit line and the word line at the corresponding side at a high potential at the same time while floating the bit line at the other side, the current can flow from a high-potential bit line to a grounded Vss, analogue reading current that is very close to the actual reading current can be simulated to use same as the reading current. The method provided in the present disclosure, the process of firstly writing signal bits, performing measurement and comparison, and then obtaining reading current is not necessary as that in the prior art.

Figure 1:
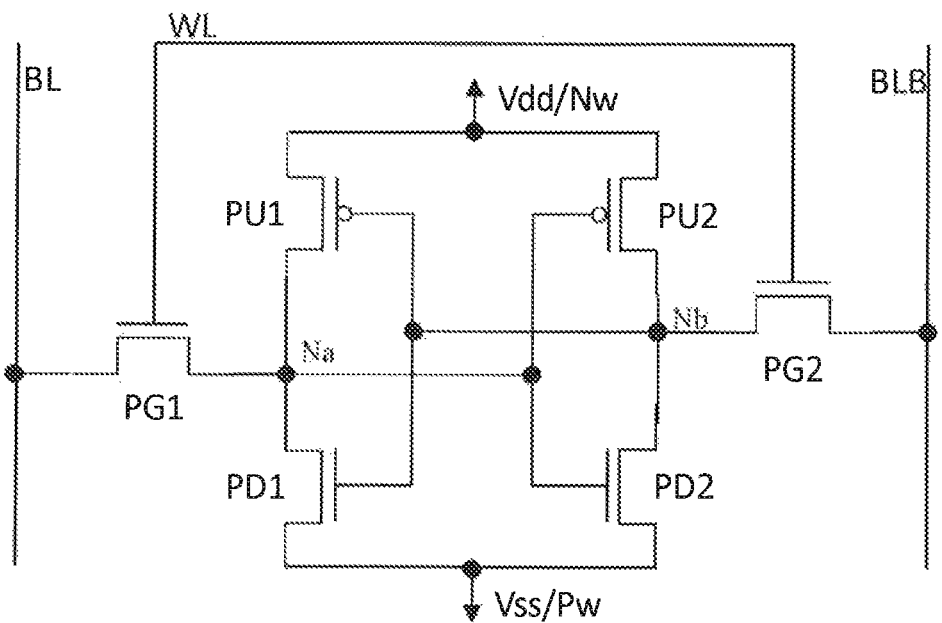
FIG. 1 shows a circuit structure diagram of one memory cell of static random access memory tested in the present disclosure.
Figure 4:
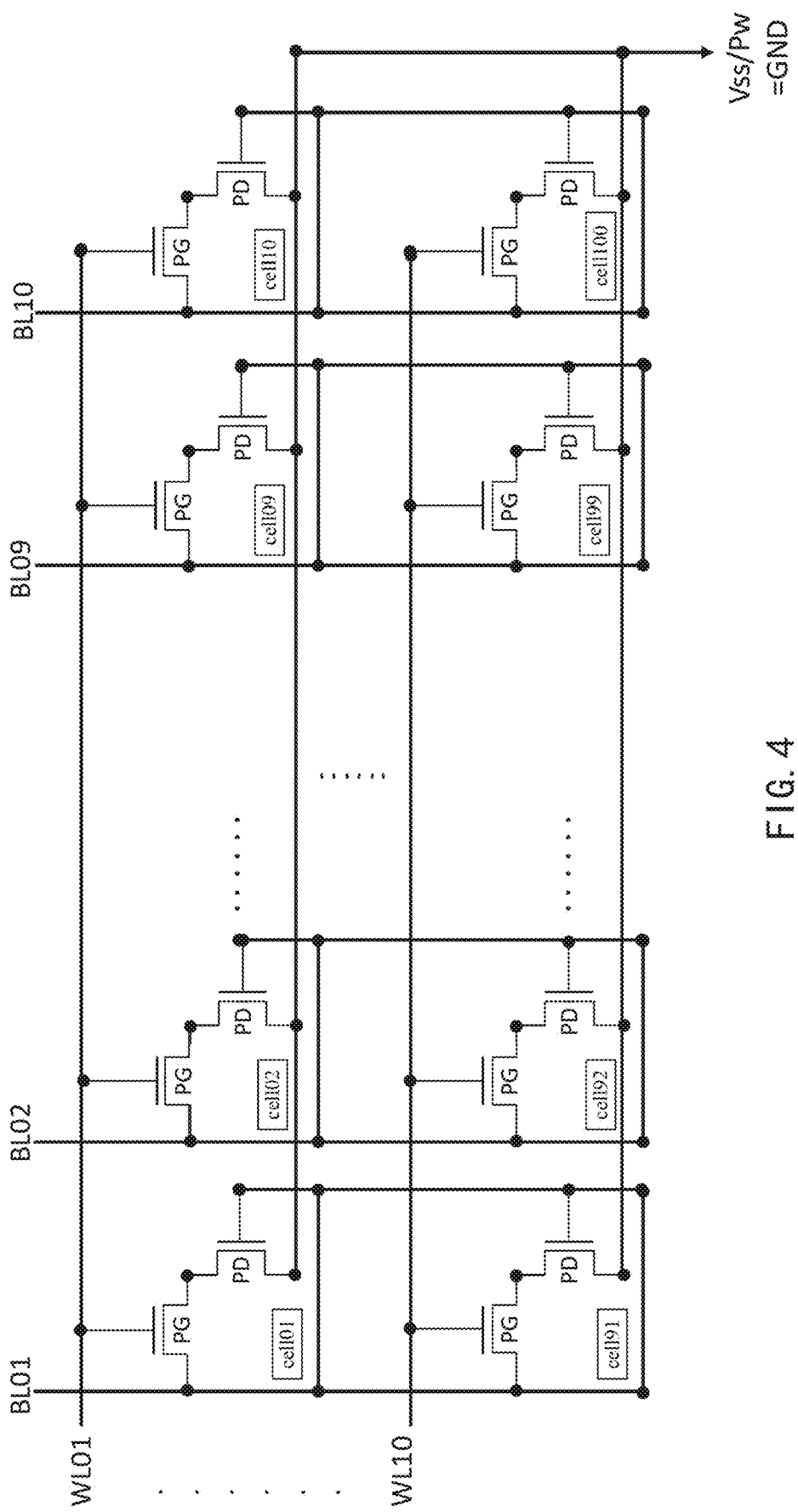
FIG. 4 shows a schematic circuit diagram of matrix-testing reading current by a testing method provided in the present disclosure.

The testing method for reading current of static random access memory provided in the present disclosure further comprises that it can be used for testing a large amount of data. In one embodiment, the static random access memory cell can be expanded to form a matrix circuit. FIG. 4 shows a schematic circuit diagram of matrix-testing reading current by a testing method provided in the present disclosure. As shown in FIG. 4, static random access memory cells arranged in columns share a group of first bit lines (BL01) and second bit lines (BLB01) (not shown in the figure); and static random access memory cells arranged in rows share one word line (WL01). A plurality of (specifically 10*10) memory cells as shown in FIG. 1 are shown in the figure, and reference can be made to the structure of the memory cells above, which will not be described in detail herein. Meanwhile, the embodiment shown in FIG. 4 intends to test the current flowing through the first bit line at the BL01-BL10 ends one by one. For convenience of illustration, only the first pass-gate transistor and the first pull-down transistor on the same side as the BL01-BL10 ends in the memory cells are shown in the figure, and each memory cell may also include other components.

In order to test the current at the BL01-BL10 ends one by one, the gate of the first pull-down transistor on the same side as the BL01-BL10 ends is connected to the corresponding first bit line. When the word line and the first bit line access a high potential at the same time and the second bit line and the remaining of the first bit lines are unloaded, the high potential of the word line conducts the first pass-gate transistor and the high potential of the first bit line conducts the first pull-down transistor. At this time, the first pass-gate transistor and the first pull-down transistor are both turned on, a passage is formed from the first bit line to a grounded Vss, and the current can flow from the first bit line to Vss through the conducted first pass-gate transistor and first pull-down transistor, and at this time, although the current at each of the BL01-BL10 ends is not actual reading current, it is analogue reading current that is very close to the actual reading current. Therefore, when measuring the current at the BL01-BL10 ends one by one, it can be considered that the current IBL at each of the BL01-BL10 ends is the reading current.

In one embodiment, in a matrix circuit, one word line (WL) is selected one by one to be set at a high potential, for example, firstly setting a word line (WL01) at a high potential, floating the remaining of the word lines (WL02-10), and setting the first bit lines at a high potential one by one in response to WL01 being set at a high potential, and for example, setting BL01, BL02 BL09 and BL10 at a high potential one by one while floating the remaining of the bit lines, and in response to the first bit line BL01 being set at a high potential and the remaining of the bit lines being unloaded, sensing current of the first bit line (BL01) to obtain reading current of memory cell 01; in response to the first bit line BL02 being set at a high potential and the remaining of the bit lines being unloaded, sensing current of the first bit line (BL02) to obtain reading current of memory cell 02; and in response to the first bit line BL10 being set at a high potential and the remaining of the bit lines being unloaded, sensing current of the first bit line BL10 to obtain reading current of memory cell 10.

In the above-mentioned manner, the measurement efficiency can be greatly improved by conducting one word line and conducting bit lines one by one. An efficient measurement method, the data of reading current of memory cells can be obtained in batches, which can be used to detect different variables in the memory cell reading current.

In one embodiment, in a matrix circuit, the testing mode can also comprise: selecting one bit line (BL) one by one to set same at a high potential, and floating the remaining of the bit lines, for example, firstly setting a bit line BL01 at a high potential, floating the remaining of the bit lines BL02-BL10, and in response to BL01 being set at a high potential, setting the word lines at a high potential one by one, for example, setting WL01, WL02 WL09, and WL10 at a high potential one by one, and in response to the first bit line BL01 being set at a high potential, sensing current of the first bit line BL01 to obtain reading current. For example, WL01 is conducted, WL02-WL10 are unloaded, and BL01 is sensed to obtain reading current of memory cell 01; WL02 is conducted, WL01 and WL03-WL10 are unloaded, and BL01 is sensed to obtain reading current of memory cell 11; and WL10 is conducted, WL01-WL09 are unloaded, and BL01 is sensed to obtain reading current of memory cell 91.

In the above-mentioned manner, the measurement efficiency can be greatly improved by conducting one bit line and conducting word lines one by one. An efficient measurement method, the data of reading current of memory cells can be obtained in batches, which can be used to detect different variables in the memory cell reading current.

The method provided in the present disclosure can test the current flowing through the second bit line at the BLB01-BLB10 ends, and reference can be made to the specific method above, which will not be described herein.

When the current at each of the BL end and the BLB end needs to be measured together, according to the matrix circuit provided in the present disclosure, in the case where the gate of the first pull-down transistor on the same side as the BL01-BL10 ends is connected to the corresponding first bit line, and the gate of the second pull-down transistor on the same side as the BLB01-BLB10 ends is connected to the corresponding second bit line, the word lines can be set at a high potential one by one, alternately setting each first bit line and each second bit line at a high potential and sensing, one by one, current of the bit lines, set at a high potential, of the memory cell of which the word line and the first bit line or the second bit line are simultaneously set at a high potential.

In another embodiment, in the case where the gate of the first pull-down transistor on the same side as the BL01-BL10 ends is connected to the corresponding first bit line, and the gate of the second pull-down transistor on the same side as the BLB01-BLB10 ends is connected to the corresponding second bit line, the first bit line and one word line are set at a high potential, current of the first bit line of the cell is sensed, and subsequently, the first bit line is uploaded, so that the second bit line of the same cell is set at a high potential and current of the second bit line is sensed; subsequently, the word line of the cell is unloaded and a word line of the next cell sharing the same second bit line with the cell is set at a high potential, and current of the second bit line current of the next cell is sensed; and subsequently, the second bit line is unloaded, and the first bit line of the next cell is set at a high potential and its current is sensed, until the reading current of each of the first bit lines and the second bit lines of each cell is completely measured one by one. For a matrix circuit, the reading current measurement method provided in the present disclosure includes, but is not limited to the above-mentioned examples.

Particular Embodiments

According to the method provided in the present disclosure, by using a layout manner, the winding of a lead is changed, so that the gate of the corresponding pull-down transistor and the corresponding bit line are in connection. During the test process, the following is used:
SRAM model: 28 nm HKMG SRAM Cell, the size being 0.127 um$^2$;
TSK model: pad 22, length*width=2199.978 um*59.9985 um;
pad pitch=99.999 um;
pad size=49.9995 um*49.9995 um;
pad space=49.9995 um;
and M082 shuttle platform: performing test by a mask shuttle platform developed by Huali Microelectronics.

Although a 28 nm SRAM platform is used as an example for design, the method provided in the present disclosure is generally applied to various SRAM generations, such as 90 nm, 65 nm, 55 nm, 40 nm, 28 nm, 22 nm, 20 nm, 16 nm, 14 nm, 10 nm, 7 nm, 5 nm, etc.

When 100 SRAM cells are tested, the matrix measurement method provided in the present disclosure is used, with the specific wiring layout manner being listed as follows:

| TSK Pin Assignment | | | | | | | | | | |
|---|---|---|---|---|---|---|---|---|---|---|
| Circuit lead | BL01 | BL02 | BL03 | BL04 | BL05 | BL06 | BL07 | BL08 | BL09 | BL10 |
| TSK pin | 16 | 14 | 13 | 15 | 17 | 6 | 8 | 10 | 9 | 7 |
| VSS/PW | WL01 | WL02 | WL03 | WL04 | WL05 | WL06 | WL07 | WL08 | WL09 | WL10 |
| 12 | 18 | 19 | 20 | 21 | 22 | 1 | 2 | 3 | 4 | 5 |

According to the testing method provided in the present disclosure, the hardware wiring layout required when measuring reading current of a large number of memory cells is simple, and the method provided in the present disclosure has simple steps, convenient operations and a high test efficiency.

Various illustrative logic blocks, modules, circuits, and algorithm steps described in conjunction with the embodiments disclosed herein can be implemented as electronic hardware, computer software, or a combination of both. In order to illustrate the interchangeability between hardware and software, various illustrative components, frames, modules, circuits, and steps are generalizedly described above in the form of functionalities thereof. Whether such functionalities are implemented as hardware or software is dependent on a specific application and design constrains imposed on the entire system. Functionalities in different manners for each particular application, but this implementation decision should not be construed as resulting in departing from the scope of the present disclosure.

In one or more exemplary embodiments, the described functions can be implemented in hardware, software, firmware or their any combination. If they are implemented as a computer program product in software, then various functions can be stored in a computer readable medium as one or more instructions or codes or transported via same. The computer readable medium comprises both a computer storage medium and a communication medium, and comprises any medium facilitating a computer program to transfer from one place to another. The storage medium can be any available medium that can be accessed by a computer. As an example but not limitation, such a computer readable medium can comprise RAM, ROM, EEPROM, CD-ROM or other optical disk storages, magnetic disk storages or other magnetic storage device, or any other medium that can be used for carrying or storing appropriate program codes in the form of instructions or data structures and can be accessed by a computer. Any connection is also rightly called a computer readable medium. For example, if the software is transported from a web site, a server, or other remote sources using a coaxial-cable, an optical fibre cable, a twisted pair, a digital subscriber line (DSL), or wireless techniques such as infrared, radio, and microwave or anything like that, then the coaxial-cable, the optical fibre cable, the twisted pair, the DSL, or the wireless techniques such as infrared, radio, microwave or anything like that are included in the definition of medium. Disks and discs as used herein comprise a compact disc (CD), a laser disc, an optical disc, a digital versatile disc (DVD), a floppy disk and a blue-ray disc, and the disks often reproduce data magnetically, and the discs optically reproduce data with laser. Combinations of the forgoing should also be included in the range of the computer readable medium.

What is claimed is:

1. A testing method for reading current of static random access memory cell, wherein the static random access memory cell comprises a first pass-gate transistor, a first pull-up transistor, a first pull-down transistor, a second pass-gate transistor, a second pull-up transistor and a second pull-down transistor connected between a first bit line and a second bit line;
- a drain of the first pull-up transistor and a drain of the first pull-down transistor are in connection and are connected to a source of the first pass-gate transistor, a gate of the first pull-up transistor and a gate of the first pull-down transistor are in connection and are connected to a source of the second pass-gate transistor, a drain of the first pass-gate transistor and the first bit line are in connection, and a gate of the first pass-gate transistor and a word line are in connection;
- and a drain of the second pull-up transistor and a drain of the second pull-down transistor are in connection and are connected to a source of the second pass-gate transistor, a gate of the second pull-up transistor and a gate of the second pull-down transistor are in connection and are connected to the source of the first pass-gate transistor, a drain of the second pass-gate transistor and the second bit line are in connection, and a gate of the second pass-gate transistor and the word line are in connection;
- the testing method comprising:
- coupling the gate of the first pull-down transistor to the first bit line;
- setting the word line and the first bit line at a high potential;
- floating the second bit line;
- and sensing current of the first bit line.

2. The testing method of claim 1 wherein the reading current flows from the first bit line set at the high potential to the first pass-gate transistor conducted by the word line set at the high potential and the first pull-down transistor conducted by the first bit line set at the high potential.

3. The testing method of claim 1, wherein the testing method further comprises:
- coupling the gate of the second pull-down transistor to the second bit line;
- setting the word line and the second bit line at a high potential;
- floating the first bit line;
- and sensing current of the second bit line.

4. The testing method of claim 3, wherein the reading current flows from the second bit line set at the high potential to the second pass-gate transistor conducted by the word line set at the high potential and the second pull-down transistor conducted by the second bit line set at the high potential.

5. The testing method of claim 1, wherein the first pull-up transistor and the second pull-up transistor are P-type MOS transistors, and the first pass-gate transistor, the first pull-down transistor, the second pass-gate transistor and the second pull-down transistor are N-type MOS transistors.

6. A testing method for reading current of static random access memory, wherein the static random access memory comprises a plurality of static random access memory cells arranged in a plurality of rows and columns, and a plurality of the static random access memory cells in the same column share one first bit line and one second bit line, and a plurality of the static random access memory cells in the same row share one word line;
- each of the static random access memory cells includes a first pass-gate transistor, a first pull-up transistor, a first pull-down transistor, a second pass-gate transistor, a second pull-up transistor and a second pull-down transistor connected between the first bit line and the second bit line;
- a drain of the first pull-up transistor and a drain of the first pull-down transistor are in connection and are connected to a source of the first pass-gate transistor, a gate of the first pull-up transistor and a gate of the first pull-down transistor are in connection and are connected to a source of the second pass-gate transistor, a drain of the first pass-gate transistor and the first bit line are in connection, and a gate of the first pass-gate transistor and the word line are in connection;
- and a drain of the second pull-up transistor and a drain of the second pull-down transistor are in connection and are connected to a source of the second pass-gate transistor, a gate of the second pull-up transistor and a gate of the second pull-down transistor are in connection and are connected to the source of the first pass-gate transistor, a drain of the second pass-gate transistor and the second bit line are in connection, and a gate of the second pass-gate transistor and the word line are in connection;
- the testing method comprising:
- coupling a gate of each of the first pull-down transistors to a corresponding first bit line;
- setting a plurality of the word lines at a high potential one by one, while floating the remaining of the word lines;
- setting a plurality of the first bit lines at a high potential one by one, while floating the remaining of the first bit lines;
- floating all of the second bit lines;
- and sensing, one by one, a first bit line current of static random access memory cells, each of which has a word line and a first bit line both set at a high potential.

7. The testing method of claim 6, wherein the reading current of the static random access memory cell flows from the first bit line set at the high potential to the first pass-gate transistor conducted by the word line set at the high potential and the first pull-down transistor conducted by the first bit line set at the high potential.

8. The testing method of claim 6, wherein the testing method further comprises:
- coupling the gate of each of the second pull-down transistors to a corresponding second bit line;
- setting a plurality of the word lines at a high potential one by one, while floating the remaining of the word lines;
- setting a plurality of the second bit lines at a high potential one by one, while floating the remaining of the second bit lines;
- floating all of the first bit lines;
- and sensing, one by one, second bit line current of static random access memory cells, each of which has a word line and a second bit line both set at a high potential.

9. The testing method of claim 8, wherein the reading current of the static random access memory cell flows from the second bit line set at the high potential to a second pass-gate transistor conducted by the word line set at the high potential and a second pull-down transistor conducted by the second bit line set at the high potential.

10. The testing method of claim 6, wherein each of the first pull-up transistors and the second pull-up transistors are a P-type MOS transistor, and each of the first pass-gate transistors, the first pull-down transistors, the second pass-gate transistors and the second pull-down transistors are an N-type MOS transistor.

\* \* \* \* \*